(12) United States Patent
Hashimoto

(10) Patent No.: US 6,964,813 B2
(45) Date of Patent: Nov. 15, 2005

(54) ULTRAVIOLET CURABLE RESIN COMPOSITION AND PHOTO SOLDER RESIST INCLUDING THE SAME

(75) Inventor: Soichi Hashimoto, Kyotanabe (JP)

(73) Assignee: Goo Chemical Co., Ltd., Kyoto (JP)

( * ) Notice: Subject to any disclaimer, the term of this patent is extended or adjusted under 35 U.S.C. 154(b) by 155 days.

(21) Appl. No.: 10/450,464

(22) PCT Filed: Dec. 6, 2001

(86) PCT No.: PCT/JP01/10657

§ 371 (c)(1),
(2), (4) Date: Jun. 13, 2003

(87) PCT Pub. No.: WO02/48226

PCT Pub. Date: Jun. 20, 2002

(65) Prior Publication Data

US 2004/0044102 A1 Mar. 4, 2004

(30) Foreign Application Priority Data

Dec. 14, 2000 (JP) .................. 2000-381110
Dec. 27, 2000 (JP) .................. 2000-398458

(51) Int. Cl.[7] .................. B32B 27/38; C08L 63/00
(52) U.S. Cl. .................. 428/413; 428/901; 522/100; 522/103; 522/170; 522/181; 525/529; 525/530; 525/533; 430/280.1; 430/281.1; 430/286.1
(58) Field of Search .................. 522/100, 101, 522/103, 170, 181; 528/306; 525/925, 523, 524, 529, 530, 532, 533; 430/75, 80, 269, 270.1, 280.1, 281.1, 286.1, 287.1, 288.1; 428/413, 414, 416, 418, 801

(56) References Cited

U.S. PATENT DOCUMENTS

| | | | |
|---|---|---|---|
| 4,948,700 A | 8/1990 | Maeda et al. | |
| 5,009,982 A | 4/1991 | Kamayachi et al. | |
| 5,124,234 A | 6/1992 | Wakata et al. | |
| 5,306,744 A | 4/1994 | Wolfersberger et al. | |
| 6,100,342 A | 8/2000 | Reich et al. | |
| 6,465,540 B1 * | 10/2002 | Kubo et al. | 522/100 |
| 2004/0006161 A1 * | 1/2004 | Daido et al. | 523/400 |

FOREIGN PATENT DOCUMENTS

| | | |
|---|---|---|
| EP | 0 750 025 A2 | 12/1996 |
| JP | 61-243869 A1 | 10/1986 |
| JP | 04-151158 A1 | 5/1992 |
| JP | 04-166944 A1 | 6/1992 |
| JP | 07-50473 A1 | 2/1995 |

OTHER PUBLICATIONS

International Preliminary Examination Report for PCT/JP01/10657 completed on Dec. 5, 2002.
European Search Report for co-pending application mailed on Feb. 11, 2005.

* cited by examiner

Primary Examiner—Michael J. Feely
(74) Attorney, Agent, or Firm—Rader, Fishman & Grauer PLLC

(57) ABSTRACT

An ultraviolet curable resin composition is provided, which is excellent in developing width and resolution, and exhibits good solder heat resistance and resistance to gold plating. This resin composition comprises (A) an ultraviolet curable resin obtained by reacting an epoxy-group containing polymer (a), which is prepared by polymerizing an ethylenically unsaturated monomer component including an ethylenically unsaturated monomer (i) having an epoxy group, with an ethylenically unsaturated monomer (b) having a carboxyl group to obtain an intermediate product, and then reacting the intermediate product with a saturated or unsaturated polybasic acid anhydride (c); (B) an epoxy compound having at least two epoxy groups in its molecule; (C) a photo-polymerization initiator; (D) a diluent; and (E) an ultraviolet curable resin obtained by reacting a novolac epoxy compound (e) with the ethylenically unsaturated monomer (b) having a carboxyl group, and then reacting a resultant intermediate product with the saturated or unsaturated polybasic acid anhydride (c). The ultraviolet curable resin (E) has an acid value of 10 mgKOH/g or more and less than 45 mgKOH/g.

12 Claims, No Drawings

ULTRAVIOLET CURABLE RESIN COMPOSITION AND PHOTO SOLDER RESIST INCLUDING THE SAME

TECHNICAL FIELD

The present invention relates to an ultraviolet curable resin composition having ultraviolet curability and thermosetting property, which is developable with a diluted alkali aqueous solution, and a photo solder resist ink including the resin composition.

BACKGROUND ART

In the past, to provide printed wiring boards having fine/high-density conductive patterns, developable liquid photo-resist inks have been used. For example, a liquid photo solder resist ink disclosed in Japanese Patent Early Publication No. 61-243869 is developable with a diluted alkali aqueous solution, which includes an ultraviolet curable resin soluble in the diluted alkali aqueous solution, photopolymerization initiator, and an epoxy compound. To obtain developability, a sufficient amount of carboxyl group is introduced.

However, since the epoxy compound is included in the above-described resist ink, thermal curing of the resist ink easily happens during a predrying step according to a reaction with the carboxyl group in the ultraviolet curable resin, so that there is a problem that defects in development or resolution easily occur. Due to this reason, an amount used of the epoxy compound is limited within a narrow range. As a result, effects brought by blending the epoxy compound such as improvements in electrical corrosion resistance and solder heat resistance of the resist film can not be sufficiently exhibited.

SUMMARY OF THE INVENTION

In view of the above problems, a concern of the present invention is to provide an ultraviolet curable resin composition, which is excellent in developing width and resolution, and exhibits good heat resistance and resistance to gold plating. In this description, the developing width means a width of predrying condition, in which developability can be maintained. The developing width is also called as a predrying control width or a predrying acceptable range.

That is, the ultraviolet curable resin composition of the present invention comprises:

(A) an ultraviolet curable resin obtained by reacting an epoxy-group containing polymer (a), which is prepared by polymerizing an ethylenically unsaturated monomer component including an ethylenically unsaturated monomer (i) having an epoxy group, with an ethylenically unsaturated monomer (b) having a carboxyl group to obtain an intermediate product, and then reacting the intermediate product with a saturated or unsaturated polybasic acid anhydride (c)

(B) an epoxy compound having at least two epoxy groups in its molecule;

(C) a photo-polymerization initiator; and (D) a diluent; and (E) an ultraviolet curable resin having an acid value of 10 mgKOH/g or more and less than 45 mgKOH/g, which is obtained by reacting a novolac epoxy compound (e) with the ethylenically unsaturated monomer (b) having a carboxyl group, and then reacting a resultant intermediate product with the saturated or unsaturated polybasic acid anhydride (c).

As a preferred embodiment of the present invention, the ethylenically unsaturated monomer component may contain an ethylenically unsaturated monomer (iii) copolymerizable with the ethylenically unsaturated monomer (i), or a compound (ii) having at least two ethylenically unsaturated groups in one molecule, or an ethylenically unsaturated monomer (iii) copolymerizable with the ethylenically unsaturated monomer (i) and the compound (ii). In the case of using the ethylenically unsaturated monomer (iii), it is possible to control a degree of photocurability and properties of a cured film of the ultraviolet curable resin composition. On the other hand, in the case of using the compound (ii), it is possible to improve the heat resistance of the cured film.

It is preferred that the compound (ii) includes di(meth) acrylate, and particularly, di(meth)acrylate having at least one oxyalkylene unit. In this case, it is possible to improve the heat resistance of the ultraviolet curable resin composition, and provide remarkably excellent developing width. In addition, it is preferred that a content of the compound (ii) is within a range of 0.1 to 10 mol % with respect to a total amount of the ethylenically unsaturated monomer component. In this range, it is possible to sufficiently obtain an effect of improving the solder heat resistance, and prevent a situation that gelation happens due to excessive copolymerization. Moreover, by preventing a reduction in the compounding amount of the ethylenically unsaturated monomer (i), a sufficient amount of the ethylenically unsaturated group having the ultraviolet curability can be introduced into the epoxy-group containing polymer (a). Therefore, the ultraviolet curable resin composition can effectively exhibit photocurability.

In addition, it is preferred that the ethylenically unsaturated monomer (i) includes glycidyl (meth)acrylate.

Moreover, it is preferred that the diluent (D) includes an ethylenically unsaturated monomer having photocurability. In this case, by diluting the ultraviolet curable resin (A) with the ethylenically unsaturated monomer having photocurability, it becomes easy to apply the ultraviolet curable resin composition. In addition, the acid value can be adjusted to provide suitable photocurability.

A further concern of the present invention is to provide a photo solder resist ink including the ultraviolet curable resin composition explained above. By using this photo solder resist ink, it is possible to provide a printed wiring board having a solder resist as a permanent film. The permanent film on the printed wiring board is excellent in developing property, resolution, and developing width, and exhibits good adhesion to substrate, electrical corrosion resistance, particularly excellent heat resistance and resistance to gold plating.

Another concern of the present invention is to provide a dry film provided by forming a film, which is obtained by drying the ultraviolet curable resin composition explained above, on a support. A cured film obtained by curing this film under exposure is excellent in developing property, resolution, and developing width, and exhibits good adhesion to substrate, electrical corrosion resistance, particularly excellent heat resistance and resistance to gold plating. Therefore, it is preferably used to form the permanent film for printed wiring boards.

These and still other concerns and advantages of the present invention will become apparent from the best mode for carrying out the invention explained below.

BEST MODE FOR CARRYING OUT THE INVENTION

An ultraviolet curable resin used for an ultraviolet curable resin composition of the present invention is obtained by reacting an epoxy-group containing polymer (a), which is prepared by polymerizing an ethylenically unsaturated monomer component including an ethylenically unsaturated monomer (i) having an epoxy group, with an ethylenically unsaturated monomer (b) having a carboxyl group to obtain an intermediate product, and then reacting the intermediate product with a saturated or unsaturated polybasic acid anhydride (c).

As the epoxy-group containing polymer (a), for example, it is preferred to use a copolymer prepared by polymerizing the ethylenically unsaturated monomer component including the ethylenically unsaturated monomer (i) and an ethylenically unsaturated monomer (iii) copolymerizabie with this monomer (i), a copolymer prepared by polymerizing the ethylenically unsaturated monomer component including the ethylenically unsaturated monomer (i) and a compound (ii) having at least two ethylenically unsaturated groups in one molecule, or a copolymer prepared by polymerizing the ethylenically unsaturated monomer component including the ethylenically unsaturated monomer (i) having epoxy group, the compound (ii) having at least two ethylenically unsaturated groups in one molecule, and the ethylenically unsaturated monomer (iii) copolymerizable with them.

A major purpose of adding the ethylenically unsaturated monomer (i) is to introduce the epoxy group into the epoxy-group containing polymer (a), and give ultraviolet curability resulting from an ethylenically unsaturated double bond to the epoxy-group containing polymer (a) according to additional reaction of the ethylenically unsaturated monomer (b) having the carboxyl group.

Specifically, as the ethylenically unsaturated monomer (i), for example, it is possible to use glycidyl (meth)acrylate, epoxy cyclohexyl derivative of (meth)acrylic acid such as (3, 4-epoxy cyclohexyl)methyl (meth)acrylate, alicyclic epoxy derivative of (meth)acrylate, β-methyl glycidyl (meth)acrylate and monoallyl diglycidyl isocyanurate. One of these compounds or a combination thereof can be used. In particular, it is preferred to use glycidyl (meth)acrylate that is easy to get. In the present description, "(meth)acrylic acid" is a generic name for "acrylic acid" and "methacrylic acid", and "(meth)acrylic-" is a generic name for "acrylic-" and "methacrylic-".

The compound (ii) having at least two ethylenically unsaturated groups in one molecule is an optional component, which is mainly used to further improve the heat resistance and the softening point of the resin composition of the present invention. In the case of using this compound (ii), it is preferred that a content of this compound is within a range of 0.1 to 10 mol % with respect to a total amount of the ethylenically unsaturated monomer component used to prepare the epoxy-group containing polymer (a). In this range, the polymerization for generating the epoxy-group containing polymer (a) proceeds under good condition. In particular, it is effective to prevent gelation. In addition, a cured film formed by the resin composition of the present invention has excellent heat resistance. In the case of using the cured film as a solder resist, excellent solder heat resistance can be also achieved. From the viewpoints of improving the heat resistance and achieving good polymerization, it is particularly preferred to use the range of 0.1 to 7 mol %.

Specifically, as the compound (ii) having at least two ethylenically unsaturated groups in one molecule, for example, it is possible to use a compound having two ethylenically unsaturated groups in one molecule such as diethylene glycol di(meth)acrylate, triethylene glycol di(meth)acrylate, polyethylene glycol di(meth)acrylate, propylene glycol di(meth)acrylate, tripropylene glycol di(meth)acrylate, polypropylene glycol di(meth)acrylate, EOPO-denatured di(meth)acrylate, bisphenol AEO adduct di(meth)acrylate, bisphenol FEO adduct di(meth)acrylate, bisphenol APO adduct di(meth)acrylate, bisphenol AEOPO adduct di(meth)acrylate, 1,6-hexanediol di(meth)acrylate, neopentyl glycol di(meth)acrylate, trimethylol propane di(meth)acrylate, cyclopentanyl di(meth)acrylate, cyclopentenyl di(meth)acrylate, or diallyl monoglycidyl isocyanurate. In addition, it is possible to use a compound having three or more ethylenically unsaturated groups in one molecule such as trimethylol propane tri(meth)acrylate, pentaerythritol tri(meth)acrylate, pentaerythritol tetra(meth)acrylate, dipentaerythritol penta(meth)acrylate, dipentaerythritol hexa (meth)acrylate, di-, tri- or more polyester of a polybasic acid and hydroxy (meth)alkylacrylate, or polyester (meth)acrylate. One of these compounds or a combination thereof can be used. When this compound (ii) is included in the epoxy-group containing polymer (a), there are advantages of reinforcing the principal chain, improving the solder heat resistance and the developing width, and adjusting the softening point.

In the compound (ii) described above, it is preferred to use di(meth)acrylate. For example, it is preferred to use di(meth)acrylate having at least one oxyalkylene unit such as oxyethylene or oxypropylene in molecule. In this case, it is possible to improve the solder heat resistance of the resin composition of the present invention, and obtain particularly wide developing width. It is preferred that the number of oxyalkylene units in one molecule of di(meth)acrylate is within a range of 1 to 40, preferably 4 to 30, and more preferably 4 to 10. When this condition is satisfied, the reaction of preparing the ultraviolet curable resin (A) stably proceeds. In addition, the developing width of the resin composition becomes wider, and a cured film thereof exhibits excellent solder heat resistance. In addition, when using di(meth)acrylate having the oxyalkylene unit and a bisphenol skeleton, it is possible to obtain remarkably improved solder heat resistance and developing width.

The ethylenically unsaturated monomer (iii) is an optional component, which is used to adjust ultraviolet curability of the resin composition of the present invention, and control the properties of the cured film thereof, if necessary. The ethylenically unsaturated monomer (iii) is not strictly limited, and may be an ethylenically unsaturated monomer copolymerizable with the monomer (i) or both of the monomer (i) and the compound (ii).

Specifically, as the ethylenically unsaturated monomer (iii), for example, it is possible to use a straight-chained or branch-chained alkyl ester of (meth)acrylic acid, (meth)acrylic acid alicyclic ester (an unsaturated bond may be included in the ring.) such as methyl (meth)acrylate, ethyl (meth)acrylate, propyl (meth)acrylate, butyl (meth)acrylate, isobutyl (meth)acrylate, t-butyl (meth)acrylate, 2-ethyl hexyl (meth)acrylate, n-octyl (meth)acrylate, n-decyl (meth)acrylate, isodecyl (meth)acrylate, lauryl (meth)acrylate, myristyl (meth)acrylate, cetyl (meth)acrylate, stearyle (meth)acrylate, cyclohexyl (meth)acrylate, and isobornyl (meth)acrylate, ethylene glycol ester (meth)acrylate such as hydroxy ethyl (meth)acrylate, methoxy ethyl (meth)acrylate, ethoxy ethyl (meth)acrylate, diethylene glycol mono(meth)acrylate, triethylene glycol mono(meth)acrylate and methoxy diethylene glycol mono(meth)acrylate, propylene glycol (meth)acrylate, butylene glycol mono(meth)acrylate, glycerol mono(meth)acrylate, or aromatic (meth)acrylate such as benzyl (meth)acrylate, (meth)acrylamide compound such as (meth)acrylamide, N-methyl (meth)acrylamide, N-propyl (meth)acrylamide, N-t-butyl (meth)acrylamide, N-t-octyl (meth)acrylamide and diacetone (meth) acrylamide, maleimide compound such as N-phenyl maleimide, N-(2-methyl phenyl) maleimide, N-cyclohexyl maleimide, N-(2,6-diethyl phenyl) maleimide, N-lauryl maleimide and N-benzyl maleimide, vinyl pyrrolidone, (meth)acrylonitrile, vinyl acetate, styrene, α-methyl styrene, or vinyl ether. One of these compounds or a combination thereof can be used. In particular, it is preferred to use the straight-chained or branch-chained alkyl ester of (meth) acrylic acid, (meth)acrylic acid fatty ester, (meth)acrylic acid aromatic ester, (meth)acrylic acid alicyclic ester (an unsaturated bond may be included in the ring.), hydroxy-alkyl (meth)acrylate, alkoxyalkyl (meth)acrylate, or the maleimide compound because it becomes easy to control the oiliness of the ultraviolet curable resin composition, and the hardness of a finally-formed resist.

In the case of using the ethylenically unsaturated monomer (iii), the content is not strictly limited. For example, it is preferred that the content is within a range of 1 to 60 mol %, preferably 1 to 55 mol %, and more preferably 10 to 50 mol % with respect to the total amount of the ethylenically unsaturated monomer component. In this range, it is possible to introduce a sufficient amount of ethylenically unsaturated group into the ultraviolet curable resin (A). In addition, it becomes easier to control the hardness of the cured film and the hydrophilicity.

The epoxy-group containing polymer (a) can be prepared according to a conventional polymerization method such as solution polymerization or emulsion polymerization. For example, when using the solution polymerization, a polymerization initiator is added to a mixture (the ethylenically unsaturated monomer component) of the ethylenically unsaturated monomer (i) and if necessary the compound (ii) or the monomer (iii) in the presence of a suitable organic solvent, and then a resultant product is heated in a nitrogen gas flow, while being agitated. Alternatively, the polymerization method may be performed under a reflux.

As the organic solvent used in the solution polymerization described above, for example, it is possible to use ketone such as methyl ethyl ketone and cyclohexanone, aromatic hydrocarbon such as toluene and xylene, acetic ester such as ethyl acetate, butyl acetate, cellosolve acetate, butyl cellosolve acetate, butyl carbitol acetate and propylene glycol monomethyl ether acetate, or dialkyl glycol ether. One of these compounds or a mixture thereof can be used.

As the polymerization initiator used in the solution polymerization described above, for example, it is possible to use a peroxide such as t-butyl hydroperoxide, di-t-butyl peroxide, lauroyl peroxide, benzoyl peroxide and di-isopropyl peroxy dicarbonate, or an azo compound such as azobisisobutylonitrile, 2, 2'-azobisisomethyl butyrate and azobiscyano-valeronitrile. One of these compounds or a combination thereof can be used.

As described above, the ultraviolet curable resin (A) of the present invention is obtained by reacting the epoxy-group containing polymer (a), which is prepared by use of the ethylenically unsaturated monomer (i) and if necessary the compound (ii) and/or the ethylenically unsaturated monomer (iii), with the ethylenically unsaturated monomer (b) having a carboxyl group to obtain an intermediate product, and then performing an additional reaction of the saturated or unsaturated polybasic acid anhydride (c) to the intermediate product.

As the ethylenically unsaturated monomer (b) having the carboxyl group, for example, it is possible to use (meth) acrylic acid, crotonic acid, cinnamic acid, a compound having a single ethylenically unsaturated group such as 2-(meth)acryloyloxyethyl succinic acid, 2-(meth) acryloyloxyethyl phthalic acid, β-carboxyethyl acrylate, acryloyloxyethyl succinate, 2-propenoic acid, 3-(2-carboxyethoxy)-3-oxopropyl ester, 2-(meth)acryloyloxyethyl tetrahydrophthalic acid, and 2-(meth) acryloyloxyethyl hexahydrophthalic acid, or a compound having a plurality of ethylenically unsaturated groups, e.g., a compound obtained by reacting a dibasic acid anhydride with a polyfunctional acrylate having hydroxyl group such as dipentaerythritol penta(meth)acrylate, trimethylolpropane di(meth)acrylate, pentaerythritol tri(meth)acrylate. One of these compounds or a combination thereof can be used. It is preferred to use the compound having the single carboxyl group, and particularly (meth)acrylic acid, or a compound containing (meth)acrylic acid as the main ingredient. In this case, there is an advantage that the ethylenically unsaturated group supplied from (meth)acrylic acid is excellent in photoreactivity.

It is preferred that a compounding amount of the ethylenically unsaturated monomer (b) is determined such that an amount of carboxyl group of ethylenically unsaturated monomer (b) per 1 mol of epoxy group of the epoxy-group containing polymer (a) is within a range of 0.7 to 1.2 mol, preferably 0.9 to 1.1 mol, and more preferably 0.95 to 1.1 mol. In the above range, the resin composition of the present invention can provide a remarkably wide developing width. In addition, it is possible to minimize an influence of the remaining ethylenically unsaturated monomer (b) having unreacted carboxyl group.

As the saturated or unsaturated polybasic acid anhydride (c), for example, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, methyl nadic acid anhydride, hexahydrophthalic anhydride, and methyl hexahydrophthalic anhydride, or a polybasic acid anhydride such as trimellitic acid anhydride, pyromellitic acid anhydride, benzophenone tetracarboxylic anhydride and methyl cyclohexene tetracarboxylic anhydride. One of these compounds or a combination thereof can be used.

The major purpose of using the saturated or unsaturated polybasic acid anhydride (c) is to give an acid value to the ultraviolet curable resin, and provide re-dispersion and re-dissolution properties in a diluted alkaline aqueous solution as well as thermosetting property. It is preferred that an amount used of the polybasic acid anhydride (c) is determined such that the acid value of the ultraviolet curable resin (A) obtained by addition of the saturated or unsaturated polybasic acid anhydride (c) is within a range of 25 to 150 mgKOH/g, and particularly 45 to 100 mgKOH/g. In this range, the resin composition of the present invention exhibits good developing property, and a cured film thereof is excellent in electric properties, electrical corrosion resistance, and water resistance. When the acid value is within the range of 50 to 85 mgKOH/g, most suitable results are obtained.

The addition reactions of the ethylenically unsaturated monomer (b) having the carboxyl group and the saturated or unsaturated polybasic acid anhydride (c) can be performed by conventional means. For example, the addition reaction of the ethylenically unsaturated monomer (b) can be performed by adding the ethylenically unsaturated monomer (b), methoxy hydroquinone as a thermal polymerization inhibitor and a catalyst such as a tertiary amine, quaternary ammonium salt or triphenyl stibine to the epoxy-group containing polymer (a), mixing and agitating a resultant mixture, and reacting the mixture at a reaction temperature of 60 to 150° C., and preferably 80 to 120° C. by conventional means. The addition reaction of the saturated or unsaturated polybasic acid anhydride (c) can be performed according to a similar method to the above.

A weight-average molecular weight of the ultraviolet curable resin (A) is not strictly limited. However, it is preferred that the weight-average molecular weight is within a range of 3000 to 400000. In this range, the resin composition has excellent sensitivity and resolution.

To stably provide good sensitivity and workability of the resin composition and maintain good properties of a finally-formed resist film, it is preferred that a compounding amount of the ultraviolet curable resin (A) used to produce the resin composition of the present invention is within a range of 10 to 80 wt % with respect to a total amount of the components of the ultraviolet curable resin composition of the present invention except for the organic solvent in the diluent (D). In this range, the resin composition of the present invention exhibits excellent curability, and a predried film thereof has remarkably reduced surface tackiness.

As the epoxy compound (B) having at least two epoxy groups in one molecule, for example, an epoxy compound that is hardly soluble in solvent or an epoxy compound that is soluble in solvent can be used. Specifically, it is possible to use a phenol novolac epoxy resin, cresol novolac epoxy resin, bisphenol A epoxy resin, bisphenol A novolac epoxy resin, bisphenol F-epoxy resin, triglycidyl isocyanurate, monoallyl diglycidyl isocyanurate, YX 4000 (manufactured by Yuka Shell Epoxy Kabushiki Kaisha), sorbitol polyglycidyl ether, N-glycidyl epoxy resin, alicyclic epoxy resin (e.g., "EHPE-3150" manufactured by Daicel Chemical Industries, Ltd.), polyol polyglycidyl ether compound, glycidyl ester compound, N-glycidyl epoxy resin, tris (hydroxyphenyl)methane-based polyfunctional epoxy resin (e.g., "EPPN-502H" manufactured by NIPPON KAYAKU Co., LTD. or "TACTIX-742" and "XD-9053" manufactured by DOW CHEMICAL), hydrogenated bisphenol A epoxy resin, dicyclopentadiene phenol epoxy resin, naphthalene epoxy resin, or a vinyl polymerization polymer having epoxy group. One of these compounds or a combination thereof can be used. In addition, a crosslinking modification may be performed to these compounds, and then used. In particular, it is preferred to use triglycidyl isocyanurate, YX 4000, phenol novolac epoxy resin, cresol novolac epoxy resin, bisphenol-A epoxy resin, or the bisphenol-A novolac epoxy resin.

It is preferred that a compounding amount of the epoxy compound (B) used to produce the resin composition of the present invention is within a range of 0.1 to 50 wt % with respect to the total amount of the components of the ultraviolet curable resin composition of the present invention except for the organic solvent in the diluent (D). In this range, the resin composition of the present invention has excellent thermosetting property and a remarkably wide developing width.

As the photopolymerization initiator (C), for example, it is possible to use benzoin, an alkyl ether of benzoin such as benzoin methyl ether, benzoin ethyl ether and benzoin isopropyl ether, acetophenone such as acetophenone, benzyl dimethyl ketal, 2, 2-diethoxy-2-phenyl acetophenone, 2, 2-dichloro acetophenone and 1-hydroxy cyclohexyl phenylketone, anthraquinone such as 2-methyl anthraquinone, 2-ethyl anthraquinone and 2-amyl anthraquinone, thioxanthone such as 2, 4-dimethyl thioxanthone, 2, 4-diethyl thioxanthone, 2-isopropyl thioxanthone, 4-isopropyl thioxanthone, 2, 4-diisopropyl thioxanthone. 2-chlorothioxanthone, and 1-chloro-4-propoxy thioxanthone, benzophenone such as benzophenone, 3, 3-dimethyl-4-methoxy benzophenone, 3, 3', 4, 4'-tetra-(t-butyl peroxyl carbonyl) benzophenone and 4-benzoyl-4'-methyl diphenyl sulfido, xanthone such as 2, 4-diisopropyl xanthone, nitrogen containing compound such as 2-methyl-1-[4-(methylthio)phenyl]-2-morpholino-propane-1-on, 2-benzyl-2-dimethylamino-1-(4-morpholinophenyl)-butane-1 and 4, 4'-bis-diethylamino-benzophenone, or (2, 4, 6-trimethyl benzoyl) diphenyl phosphine oxide. These compounds may be used together with a conventional photopolymerization enhancer or sensitizer such as a tertiary amine, e.g., p-dimethyl aminobenzoic acid ethyl ester, p-dimethyl aminobenzoic acid isoamyl ester, or 2-dimethyl aminoethyl benzoate. One of these photopolymerization initiators or a combination of thereof can be used.

In addition, as a sensitizer for laser exposure, for example, it is possible to use a coumarin derivative such as 7-dimethylamino-4-methylcoumarin and 4, 6-diethyl-7-ethylaminocoumarin, carbocyanine dye, xanthene dye, or a metallocene such as bis($\eta^5$-2, 4-cyclopentadiene-1-yl)-bis (2,6-difluoro-3-(1H-pyrrole titanium. In this case, the ultraviolet curable resin composition of the present invention is allowed to have near-infrared curability or visual-light curability.

To provide good balance between the photocurability and properties of the obtained permanent film, it is preferred that a compounding amount of the photopolymerization initiator (C) used to produce the resin composition of the present invention is within a range of 0.1 to 30 wt % with respect to the total amount of the components of the ultraviolet curable resin composition of the present invention except for the organic solvent in the diluent (D). In this range, the resin composition of the present invention exhibits excellent ultraviolet curability as well as remarkably improved heat resistance and electrical corrosion resistance of a cured film thereof.

As the diluent (D), at least one of an ethylenically unsaturated photopolymerizable monomer (D-1) and an organic solvent (D-2) can be used. As the ethylenically unsaturated monomer (D-1), for example, it is possible to use 2-hydroxyethyl (meth)acrylate, 2-hydroxypropyl (meth) acrylate, N-vinyl pyrrolidone, (meth)acryloyl morpholine, methoxy tetraethylene glycol (meth)acrylate, methoxy polyethylene glycol (meth)acrylate, polyethylene glycol di(meth)acrylate, N, N-dimethyl (meth)acrylamide, N-methylol (meth)acrylamide, N, N-dimethyl aminopropyl (meth)acrylamide, N, N-dimethyl aminoethyl (meth) acrylate, N, N-dimethyl aminopropyl (meth)acrylate, melamine (meth)acrylate, diethylene glycol di(meth) acrylate, triethylene glycol di(meth)acrylate, propylene glycol di(meth)acrylate, tripropylene glycol di(meth)acrylate, phenoxyethyl (meth)acrylate, tetrahydrofurfuryl (meth) acrylate, cyclohexyl (meth)acrylate, trimethylolpropane di(meth)acrylate, trimethylolpropane tri(meth)acrylate, pentaerythritol tri(meth)acrylate, pentaerythritol tetra(meth) acrylate, dipentaerythritol penta(meth)acrylate, dipentaerythritol hexa(meth)acrylate, isobonyl (meth)acrylate, cyclopentanyl mono(meth)acrylate, cyclopentenyl mono (meth)acrylate, trimethylolpropane EO-denatured triacrylate, cyclopentanyl di(meth)acrylate, cyclopentenyl di(meth)acrylate, mono-, di-, tri- or more polyester of a polybasic acid and hydroxyalkyl (meth)acrylate, or a (meth)

acrylate monomer such as polyester (meth)acrylate and urethane (meth)acrylate. One of these compounds or a combination thereof can be used.

On the other hand, as the organic solvent (D-2), for example, it is possible to use a straight-chained, branch-chained, secondary or multiple alcohol such as ethanol, propyl alcohol, isopropyl alcohol, butyl alcohol, isobutyl alcohol, 2-butyl alcohol, hexanol, and ethylene glycol, ketone such as methyl ethyl ketone and cyclohexanone, aromatic hydrocarbon such as toluene and xylene, an oil aromatic mixture solvent such as "SWASOL SERIES" (manufactured by Maruzen Petrochemical Co., Ltd.), "SOLVESSO SERIES" (manufactured by EXXON CHEMICAL COMPANY), cellosolve such as cellosolve and butyl cellosolve, carbitol such as carbitol and butyl carbitol, propylene glycol alkyl ether such as propylene glycol methyl ether, polypropylene glycol alkyl ether such as dipropylene glycol methyl ether, acetic ester such as ethyl acetate, butyl acetate, cellosolve acetate, butyl cellosolve acetate, butyl carbitol acetate and propylene glycol monomethyl ether acetate, or dialkyl glycol ether. One of these compounds or a combination of thereof can be used.

The ethylenically unsaturated monomer (D-1) used as the diluent (D) dilutes the ultraviolet curable resin (A) to provide easiness of applying the resin composition, and controls the acid value of the resin composition to provide suitable photocurability. In addition, the organic solvent (D-2) used as the diluent (D) dissolves and dilutes the ultraviolet curable resin (A), so that the resin composition becomes a liquid type resin composition that can be easily applied, and a film can be easily formed by drying the resin composition.

By the way, the resin composition of the present invention does not necessarily require the ethylenically unsaturated monomer (D-1) as the diluent (D). However, when using the ethylenically unsaturated monomer (D-1), it is preferred that the compounding amount is 50 wt % or less with respect to the total amount of components of the ultraviolet curable resin composition of the present invention except for the organic solvent in the diluent (D). When the compounding amount is more than 50 wt %, there is a fear of deteriorating the surface tackiness of the predried film. In such a case, when a negative photomask having a required pattern is directly put on the predried film, and then exposure is performed, a contamination of the photomask may happen.

On the other hand, the organic solvent (D-2) used as the diluent (D) is an essential component to obtain the ultraviolet curable resin composition developable with a diluted alkali aqueous solution. It is required that the organic solvent can be rapidly evaporated from the resin composition by predrying without being left in the predried film. It is preferred that a compounding amount of the organic solvent (D-2) is 5 wt % or more with respect to the total amount of components of the ultraviolet curable resin composition of the present invention. When the compounding amount is less than 5 wt %, there is a fear that it becomes difficult to uniformly apply the resin composition. An upper limit of the compounding amount of the organic solvent is not strictly limited because a suitable amount of the organic solvent is determined according to an applying method used.

The ultraviolet curable resin (E) used in the present invention is obtained by reacting a novolac epoxy compound (e) with the ethylenically unsaturated monomer (b) having a carboxyl group, and then reacting a resultant intermediate product with the saturated or unsaturated polybasic acid anhydride (c). The ultraviolet curable resin (E) has an acid value of 10 mgKOH/g or more and less than 45 mgKOH/g, preferably 20 to 40 mgKOH/g, and more preferably 25 to 33 mgKOH/g.

The novolac epoxy compound (e) described above can be obtained by reacting an epihalohydrin with various types of phenol novolac resins, which are prepared by reacting formaldehyde with various types of phenols in the presence of a basic catalyst. The phenols are not strictly limited. For example, it is possible to use phenol, cresol, resorcin, catechol, hydroquinone, bisphenol A, bisphenol F, bisphenol S, bisphenol AD, bisphenol compounds or dihydroxynaphthalene. As the novolac epoxy compound (e), for example, it is preferred to use a phenol novolac epoxy resin, cresol novolac epoxy resin, or a bisphenol A-novolac epoxy resin.

In general, it is difficult to dissolve or redisperse the ultraviolet curable resin (E) having an acid value less than 45 mgKOH/g in a diluted alkali aqueous solution. This means that when only the component (E) is used as the ultraviolet curable resin, it becomes difficult to provide the ultraviolet curable resin composition developable with the diluted alkali aqueous solution.

However, since the ultraviolet curable resin composition of the present invention uses the ultraviolet curable resin (A) having a sufficient acid value together with the ultraviolet curable resin (E), it becomes developable with the diluted alkali aqueous solution, and achieves good developing property and resolution. In addition, as compared with the case of using only an ultraviolet curable resin having the acid value of 45 mgKOH/g or more, it is possible to provide a predried film having good surface tackiness and a wide developing width. Therefore, it is very effective for so-called "on-contact exposing". Moreover, it becomes easy to control the predrying conditions, and a finally-formed cured film has excellent solder heat resistance and resistance to gold plating.

The ethylenically unsaturated monomer (b) having the carboxyl group and the saturated or unsaturated polybasic acid anhydride (c) used to obtain the ultraviolet curable resin (E) may be the same as them used to prepare the ultraviolet curable resin (A).

It is preferred that a compounding amount of the ethylenically unsaturated monomer (b) having the carboxyl group used to prepare the ultraviolet curable resin (E) is determined such that an amount of carboxyl group of the ethylenically unsaturated monomer (b) per 1 mol of epoxy group of the novolac epoxy compound (e) is within a range of 0.7 to 1.2 mol, preferably 0.9 to 1.1 mol, and more preferably 0.95 to 1.1 mol. In this range, the resin composition of the present invention has a remarkably wide developing width. in addition, it is possible to minimize an influence of the remaining ethylenically unsaturated monomer (b) having unreacted carboxyl group.

On the other hand, the major purpose of using the saturated or unsaturated polybasic acid anhydride (c) is to give an acid value to the ultraviolet curable resin (E), and provide re-dispersion and re-dissolution properties in a diluted alkaline aqueous solution as well as thermosetting property. An amount used of the polybasic acid anhydride (c) is determined such that the acid value of the ultraviolet curable resin (E) obtained by addition of the saturated or unsaturated polybasic acid anhydride (c) is within a range of 10 mgKOH/g or more and less than 45 mgKOH/g. In this range, the resin composition of the present invention exhibits good developing property, and a cured film thereof is excellent in electric properties, electrical corrosion resistance, and water resistance.

To stably provide good sensitivity and workability of the resin composition and maintain good properties of a resist film thereof, it is preferred that a compounding amount of the ultraviolet curable resin (E) used to produce the resin composition of the present invention is within a range of 1 to 40 wt % with respect to a total amount of the components of the ultraviolet curable resin composition of the present invention except for the organic solvent in the diluent (D). In this range, the resin composition of the present invention has excellent curability and good resist properties. A ratio of the ultraviolet curable resin (A) to the ultraviolet curable resin (E) is not strictly limited. However, when a weight ratio of (A):(E) is 95:5 to 40:60, and preferably 95:5 to 60:40, most suitable results are obtained.

Besides the above-explained components, the ultraviolet curable resin composition of the present invention may contain a blocked isocyanate, a thermosetting component such as amino resins, an ultraviolet curable epoxy (meth) acrylate, for example, a compound obtained by adding (meth)acrylic acid to a bisphenol A epoxy resin, phenol novolac epoxy resin, cresol novolac epoxy resin or an alicyclic epoxy resin, or a compound obtained by adding (meth)acrylic acid to a bisphenol A epoxy resin, bisphenol-F epoxy resin or an alicyclic epoxy resin, and then adding a saturated or unsaturated polybasic acid anhydride such as maleic anhydride, succinic anhydride, itaconic anhydride, phthalic anhydride and tetrahydrophthalic anhydride to a resultant mixture (In the case of using the novolac epoxy resin, the acid value does not correspond to the range of the component (E). ), an ultraviolet curable polymer obtained by reacting hydroxyalkyl (meth)acrylate, (meth)acrylate having epoxy group with a copolymer of maleic anhydride and the other ethylenically unsaturated monomer, a copolymer of an ethylenically unsaturated compound such as styrene-(meth) acrylic acid-(meth)acrylic acid ester copolymer, an ultraviolet curable polymer obtained by reacting an ethylenically unsaturated monomer having epoxy group with them, an ultraviolet curable polymer obtained by adding (meth) acrylic acid to a vinyl copolymer containing the ethylenically unsaturated monomer having epoxy group as a monomer unit, or a high molecolar compound such as styrene-maleic resin, diallyl phthalate resin, phenoxy resin, melamine resin, urethane resin, and a fluorine containing resin.

If necessary, the ultraviolet curable resin composition of the present invention may contain various types of additives such as an epoxy resin curing agent, curing enhancer, filler, coloring agent, leveling agent, adhesion supplying agent, thixotropic agent, polymerization inhibitor, antihalation agent, flame retardant, defoamer, dispersion stabilizing agent, high molecular dispersing agent and an anti-oxidant.

The ultraviolet curable resin composition of the present invention can be obtained by kneading the above-explained components and the additives with a conventional kneading means such as three rolls, ball mill and sand mill. For example, a first mixture is prepared by mixing a part of components (A) to (E), for example, a part of the component (D) with the component (B), and on the other hand, a second mixture is prepared by mixing the components (A), (C) and (E) with the balance of the component (D). In this case, the first mixture may be mixed with the second mixture at the time of actual use to prepare the ultraviolet curable resin composition of the present invention.

Directions for use of the ultraviolet curable resin composition of the present invention are not strictly limited. For example, the resin composition is preferably used as a photo solder resist ink, by use of which a resist pattern can be formed on a substrate such as printed wiring boards. In this case, by forming a cured film having a required pattern of the photo solder resist ink on the substrate, the resist pattern is obtained on the substrate.

As an example, a resist pattern can be formed on a substrate according to the following method. First, the photo solder resist ink is applied on the substrate by use of dipping, spraying, spin coating, roll coating, curtain coating, screen printing, and so on. Then, to volatilize the organic solvent of the diluent from the applied film, predrying is performed at a temperature of 60 to 120° C., to obtain a predried film.

Next, a negative mask having a required pattern is directly or indirectly put on the predried film, and ultraviolet is radiated to the predried film through the mask by use of a chemical lamp, low-pressure mercury lamp, intermediate-pressure mercury lamp, high-pressure mercury lamp, ultra-high-pressure mercury lamp, xenon lamp, metalhalide lamp, and so on. Then, developing is performed to obtain a pattern. In addition, a heat treatment is performed at a temperature of 120 to 180° C. for 30 to 90 minutes to cure the epoxy compound to obtain a resist pattern of a cured film having excellent film strength, hardness and chemical resistance on the substrate.

As an alkaline solution used in the developing step, for example, it is possible to use an aqueous solution of sodium carbonate, potassium carbonate, ammonium carbonate, sodium hydrogencarbonate, potassium hydrogencarbonate, ammonium hydrogencarbonate, sodium hydroxide, potassium hydroxide, ammonium hydroxide, or lithium hydroxide. Besides these alkaline solutions, it is possible to use an organic amine such as monoethanol amine, diethanol amine, triethanol amine, monoisopropanol amine, diisopropanol amine, or triisopropanol amine. One of these compounds or a combination thereof can be used. As a solvent for the alkaline solution, it is possible to use water, or a mixture of water and an organic solvent having hydrophilicity, e.g., a lower alcohol.

By use of the ultraviolet curable resin composition or the photo solder resist ink of the present invention, it is possible to provide a dry film composed of a support and a dry film resist formed on a surface of the support. In this case, it is preferred that the film thickness is within a range of 10 to 100 μm. As the support, for example, it is possible to use a polyethylene terephthalate film having a thickness of 5 to 100 μm. For example, the film of the ultraviolet curable resin composition or the photo solder resist ink can be obtained by drying the ultraviolet curable resin composition or the photo solder resist ink applied on the support.

The resin composition of the present invention is particularly suitable for the photo solder resist ink. However, the application field is not limited thereto. For example, the resin composition can be used to form a protective film for color filters. In addition, the resin composition may be used as a composition for preparing color filter pixels by selecting a suitable coloring agent, for example, an organic pigment such as azo lake pigment, insoluble azo pigment and phthalocyanine pigment, inorganic pigment such as iron blue, iron oxide and cobalt, solvent dye, basic dye or a disperse dye.

EXAMPLES

The present invention is explained below according to Examples. However, the present invention is not limited to them. Unless otherwise specified, "parts" and "%" used below is based on weight.

Synthesis Example 1

A mixture of 70 parts of glycidyl methacrylate, 10 parts of "NK Ester 9G" [manufactured by SHINNAKAMURA CHEMICAL INDUSTRIAL CO., LTD., polypropylene glycol #400 dimethacrylate (n=9), molecular weight=536], 20 parts of methyl methacrylate, 100 parts of carbitol acetate, 0.2 parts of laurylmercaptan, and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours for an additional reaction, 45 parts of tetrahydrophthalic anhydride and 79 parts of carbitol acetate were added to the mixture. The obtained mixture was kept at 100° C. for 3 hours to obtain a 50% ultraviolet curable resin solution (A-1). An acid value measured with respect to the resin component in this ultraviolet curable resin solution (A-1) is 91 mgKOH/g.

Synthesis Example 2

A mixture of 70 parts of glycidyl methacrylate, 10 parts of "NK Ester 9PG" [manufactured by SHINNAKAMURA CHEMICAL INDUSTRIAL CO., LTD., polypropylene glycol #400 dimethacrylate (n=7), molecular weight=536], 15 parts of methyl methacrylate, 5 parts of t-butyl methacrylate, 100 parts of carbitol acetate and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours for an additional reaction, 38 parts of tetrahydrophthalic anhydride and 72 parts of carbitol acetate were added to the mixture. The obtained mixture was kept at 100° C. for 3 hours to obtain a 50% ultraviolet curable resin solution (A-2). An acid value measured with respect to the resin component in this ultraviolet curable resin solution (A-2) is 80 mgKOH/g.

Synthesis Example 3

A mixture of 70 parts of glycidyl methacrylate, 5 parts of "NK Ester A-BPE-4" [manufactured by SHINNAKAMURA CHEMICAL INDUSTRIAL CO., LTD., 2, 2-bis[4-(acryloxy.diethoxy)phenyl] propane, molecular weight= 512], 15 parts of methyl methacrylate, 10 parts of cyclohexyl maleimide, 100 parts of carbitol acetate, 0.1 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours for an additional reaction, 38 parts of tetrahydrophthalic anhydride and 72 parts of carbitol acetate were added to the mixture. The obtained mixture was kept at 100° C. for 3 hours to obtain a 50% ultraviolet curable resin solution (A-3). An acid value measured with respect to the resin component in this ultraviolet curable resin solution (A-3) is 80 mgKOH/g.

Synthesis Example 4

A mixture of 70 parts of glycidyl methacrylate, 14 parts of "Blemmer 43 DB-40B " [manufactured by NOF Corp., bisphenol-A polyethylene glycol polypropylene glycol adduct dimethacrylate, molecular weight=approximately 1180], 6 parts of methyl methacrylate, 10 parts of t-butyl methacrylate, 100 parts of carbitol acetate, 0.3 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 105° C. for 24 hours for an additional reaction, 38 parts of tetrahydrophthalic anhydride and 72 parts of carbitol acetate were added to the mixture. The obtained mixture was kept at 100° C. for 3 hours to obtain a 50% ultraviolet curable resin solution (A-4). An acid value measured with respect to the resin component in this ultraviolet curable resin solution (A-4) is 80 mgKOH/g.

Synthesis Example 5

A mixture of 70 parts of glycidyl methacrylate, 10 parts of "NK Ester TMPT" [manufactured by SHINNAKAMURA CHEMICAL INDUSTRIAL CO., LTD., trimethylolpropane trimethacrylate, molecular weight=338], 15 parts of methyl methacrylate, 5 parts of t-butyl methacrylate, 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 105° C. for 24 hours for an additional reaction, 38 parts of tetrahydrophthalic anhydride and 72 parts of carbitol acetate were added to the mixture. The obtained mixture was kept at 100° C. for 3 hours to obtain a 50% ultraviolet curable resin solution (A-5). An acid value measured with respect to the resin component in this ultraviolet curable resin solution (A-5) is 80 mgKOH/g.

Synthesis Example 6

A mixture of 80 parts of glycidyl methacrylate, 20 parts of "NK Ester 9G" [manufactured by SHINNAKAMURA CHEMICAL INDUSTRIAL CO., LTD., polyethylene glycol #400 dimethacrylate (n=9), molecular weight=536], 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 42.6 parts of acrylic acid and 0.2 arts of dimethylbenzylamine were added to the 50% copolymer solution. After a resultant mixture was kept at 100° C. for 24 hours for an additional reaction, 45 parts of tetrahydrophthalic anhydride and 84 parts of carbitol acetate were added to the mixture. The obtained mixture was kept at 100° C. for 3 hours to obtain a 50% ultraviolet curable resin solution (A-6). An acid value measured with respect to the resin component in this ultraviolet curable resin solution (A-6) is 89 mgKOH/g.

Synthesis Example 7

A mixture of 70 parts of glycidyl methacrylate, 1 parts of "NK Ester 9PG" [manufactured by SHINNAKAMURA CHEMICAL INDUSTRIAL CO., LTD., polypropylene glycol #400 dimethacrylate (n=7), molecular weight=536], 15 parts of methyl methacrylate, 14 parts of t-butyl methacrylate, 100 parts of carbitol acetate and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours for an additional reaction, 31 parts of tetrahydrophthalic anhydride and 68 parts of carbitol acetate were added to the mixture. The obtained mixture was kept at 100° C. for 3 hours to obtain a 50% ultraviolet curable resin solution (A-7). An acid value measured with respect to the resin component in this ultraviolet curable resin solution (A-7) is 68 mgKOH/g.

Synthesis Example 8

A mixture of 70 parts of glycidyl methacrylate, 20 parts of methyl methacrylate, 10 parts of t-butyl methacrylate, 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours for an additional reaction, 45 parts of tetrahydrophthalic anhydride and 79 parts of carbitol acetate were added to the mixture. The obtained mixture was kept at 100° C. for 3 hours to obtain a 50% ultraviolet curable resin solution (A-8). An acid value measured with respect to the resin component in this ultraviolet curable resin solution (A-8) is 91 mgKOH/g.

Synthesis Example 9

A mixture of 70 parts of glycidyl methacrylate, 20 parts of methyl methacrylate, 10 parts of cyclohexyl maleimide, 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 105° C. for 24 hours for an additional reaction, 38 parts of tetrahydrophthalic anhydride and 72 parts of carbitol acetate were added to the mixture. The obtained mixture was kept at 100° C. for 3 hours to obtain a 50% ultraviolet curable resin solution (A-9). An acid value measured with respect to the resin component in this ultraviolet curable resin solution (A-9) is 80 mgKOH/g.

Synthesis Example 10

214 parts of "EPICLON N-680"(manufactured by DAINIPPON INK AND CHEMICALS INCORPORATED, cresol-novolac epoxy resin, Epoxy Equivalents: 214) was dissolved in 60 parts of carbitol acetate, while a resultant mixture being heated. Next, 74 parts of acrylic acid, 0.1 parts of hydroquinone and 0.7 parts of benzyldimethylamine were added to the resultant mixture, while the mixture being agitated, and then kept at a temperature of 90 to 100° C. for 24 hours by conventional means. In addition, 95 parts of carbitol acetate was added to the obtained reaction solution. After agitating the mixed solution, it was cooled to obtain an epoxy acrylate solution. Next, 30 parts of tetrahydrophthalic anhydride and 57 parts of carbitol acetate were added to the epoxy acrylate solution, and kept at 100° C. for 3 hours to obtain a 60% ultraviolet curable resin solution (E-1). An acid value measured with respect to the resin component in this ultraviolet curable resin solution (E-1) is 35 mgKOH/g.

Synthesis Example 11

214 parts of "EPICLON N-695"(manufactured by DAINIPPON INK AND CHEMICALS INCORPORATED, cresol-novolac epoxy resin, Epoxy Equivalents: 214) was dissolved in 60 parts of carbitol acetate, while a resultant mixture being heated. Next, 74 parts of acrylic acid, 0.1 parts of hydroquinone and 0.7 parts of benzyldimethylamine were added to the resultant mixture, while the mixture being agitated, and then kept at a temperature of 90 to 100° C. for 24 hours by conventional means. In addition, 95 parts of carbitol acetate was added to the obtained reaction solution. After agitating the mixed solution, it was cooled to obtain an epoxy acrylate solution. Next, 36 parts of tetrahydrophthalic anhydride and 61 parts of carbitol acetate were added to the epoxy acrylate solution, and kept at 100° C. for 3 hours to obtain a 60% ultraviolet curable resin solution (E-2). An acid value measured with respect to the resin component in this ultraviolet curable resin solution (E-2) is 41 mgKOH/g.

Synthesis Example 12

214 parts of "EPICLON N-680"(manufactured by DAINIPPON INK AND CHEMICALS INCORPORATED, cresol-novolac epoxy resin, Epoxy Equivalents: 214) was dissolved in 60 parts of carbitol acetate, while a resultant mixture being heated. Next, 74 parts of acrylic acid, 0.1 parts of hydroquinone and 0.7 parts of benzyldimethylamine were added to the resultant mixture, while the mixture being agitated, and then kept at a temperature of 90 to 100° C. for 24 hours by conventional means. In addition, 95 parts of carbitol acetate was added to the obtained reaction solution. After agitating the mixed solution, it was cooled to obtain an epoxy acrylate solution. Next, 24 parts of tetrahydrophthalic anhydride and 47 parts of carbitol acetate were added to the epoxy acrylate solution, and kept at 100° C. for 3 hours to obtain a 60% ultraviolet curable resin solution (E-3). An acid value measured with respect to the resin component in this ultraviolet curable resin solution (E-3) is 28 mgKOH/g.

Synthesis Example 13

214 parts of "EPICLON N-680"(manufactured by DAINIPPON INK AND CHEMICALS INCORPORATED, cresol-novolac epoxy resin, Epoxy Equivalents: 214) was dissolved in 60 parts of carbitol acetate, while a resultant mixture being heated. Next, 74 parts of acrylic acid, 0.1 parts of hydroquinone and 0.7 parts of benzyldimethylamine were added to the resultant mixture, while the mixture being agitated, and then kept at a temperature of 90 to 100° C. for 24 hours by conventional means. In addition, 95 parts of carbitol acetate was added to the obtained reaction solution. After agitating the mixed solution, it was cooled to obtain an epoxy acrylate solution. Next, 91 parts of tetrahydrophthalic anhydride and 97 parts of carbitol acetate were added to the epoxy acrylate solution, and kept at 100° C. for 3 hours to obtain a 60% ultraviolet curable resin solution (R-1). An acid value measured with respect to the resin component in this ultraviolet curable resin solution (R-1) is 89 mgKOH/g.

Examples 1 to 12 and Comparative Examples 1 to 3

With respect to each of the ultraviolet curable resin solutions (A-1) to (A-9), (E-1) to (E-3), and (R-1) obtained in the above-described Synthesis Examples, a mixture was prepared according to compounding amounts listed in Table 1, and then kneaded by use of three rolls. As a result, liquid photo solder resist inks of Examples 1 to 12 and Comparative Examples 1 to 3 were obtained, which are developable with a diluted alkali aqueous solution.

In Table 1, "EPICLON N-695" is a cresol novolac-type epoxy resin (manufactured by DAINIPPON INK AND CHEMICALS INCORPORATED). "YX 4000" is an epoxy compound (manufactured by Yuka Shell Epoxy Kabushiki Kaisha, epoxy equivalent: 195). "TEPIC-S" is triglycidyl isocyanurate (manufactured by NISSAN CHEMICAL INDUSTRIES, epoxy equivalent: 100). "IRGACURE 907" is a photopolymerization initiator (manufactured by CIBA-GEIGY CORPORATION, (2-methyl-1-[4-methylthio (phenyl)]-2-morpholinopropane-1-on)). "KAYACURE DETX-S" is a photopolymerization initiator (manufactured by Nippon Kayaku Co., Ltd., 2, 4-diethyl thioxanthone). "MODAFLOW" is a leveling agent (manufactured by MONSANTO COMPANY). "SWASOL 1500" is an oil aromatic mixture solvent (manufactured by Maruzen Petrochemical Co., Ltd.).

Properties of each of the resist inks and a printed wiring board with a solder resist formed by use of the resist ink were evaluated according to the following test methods. Experimental results are shown in Tables 2 and 3.

TABLE 1

|  | Examples | | | | | | | | | | | | Comparative Examples | | |
|---|---|---|---|---|---|---|---|---|---|---|---|---|---|---|---|
|  | 1 | 2 | 3 | 4 | 5 | 6 | 7 | 8 | 9 | 10 | 11 | 12 | 1 | 2 | 3 |
| Ultraviolet curable resin solution (A-1) | 40 |  |  |  |  |  |  |  |  | 40 |  |  |  |  |  |
| Ultraviolet curable resin solution (A-2) |  | 40 |  |  |  |  |  |  |  |  |  |  |  |  |  |
| Ultraviolet curable resin solution (A-3) |  |  | 30 |  |  |  |  |  |  |  | 40 |  |  |  |  |
| Ultraviolet curable resin solution (A-4) |  |  |  | 30 |  |  |  |  |  |  |  |  |  |  |  |
| Ultraviolet curable resin solution (A-5) |  |  |  |  | 30 |  |  |  |  |  |  | 40 |  |  |  |
| Ultraviolet curable resin solution (A-6) |  |  |  |  |  | 40 |  |  |  |  |  |  |  |  |  |
| Ultraviolet curable resin solution (A-7) |  |  |  |  |  |  | 40 |  |  |  |  |  |  |  |  |
| Ultraviolet curable resin solution (A-8) |  |  |  |  |  |  |  | 40 |  |  |  |  |  | 30 |  |
| Ultraviolet curable resin solution (A-9) |  |  |  |  |  |  |  |  | 40 |  |  |  |  |  |  |
| Ultraviolet curable resin solution (E-1) | 10 |  | 20 |  | 20 |  | 10 |  |  |  |  |  |  |  | 20 |
| Ultraviolet curable resin solution (E-2) |  | 10 |  | 20 |  | 10 |  | 10 | 10 |  |  |  |  |  |  |
| Ultraviolet curable resin solution (E-3) |  |  |  |  |  |  |  |  |  | 10 | 10 | 10 |  |  |  |
| Ultraviolet curable resin solution (R-1) |  |  |  |  |  |  |  |  |  |  |  |  | 50 | 20 | 30 |
| Dipentaerythritol hexaacrylate | 5 | 5 | 5 | 5 | 5 | 5 | 5 | 5 | 5 | 5 | 5 | 5 | 5 | 5 | 5 |
| EPICLON N-695 | 10 | 10 | 10 |  |  | 10 |  | 10 | 10 | 10 |  |  | 10 | 10 |  |
| YX4000 |  |  |  | 10 |  |  | 10 |  |  |  |  |  |  |  |  |
| TEPIC-S |  |  |  |  | 10 | 10 |  |  |  |  | 10 | 10 |  |  |  |
| IRGACURE 907 | 4 | 4 | 4 | 4 | 4 | 4 | 4 | 4 | 4 | 4 | 4 | 4 | 4 | 4 | 4 |
| KAYACURE DETX-S | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| MODAFLOW | 1 | 1 | 1 | 1 | 1 | 1 | 1 | 1 | 1 | 1 | 1 | 1 | 1 | 1 | 1 |
| Silica (average grain size: 1 μm) | 10 | 10 | 10 | 10 | 10 | 10 | 10 | 10 | 10 | 10 | 10 | 10 | 10 | 10 | 10 |
| Barium sulfate | 17 | 17 | 17 | 17 | 17 | 17 | 17 | 17 | 17 | 17 | 17 | 17 | 17 | 17 | 17 |
| Melamine | 1 | 1 | 1 | 1 | 1 | 1 | 1 | 1 | 1 | 1 | 1 | 1 | 1 | 1 | 1 |
| Phthalocyanine green | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| SWASOL 1500 | 1 | 1 | 1 | 1 | 1 | 1 | 1 | 1 | 1 | 1 | 1 | 1 | 1 | 1 | 1 |

TABLE 2

| Test items | | | Examples | | | | | | | | | | | | Comparative Examples | | |
|---|---|---|---|---|---|---|---|---|---|---|---|---|---|---|---|---|---|
|  |  |  | 1 | 2 | 3 | 4 | 5 | 6 | 7 | 8 | 9 | 10 | 11 | 12 | 1 | 2 | 3 |
| Predrying property/ Drying temperature (80° C.) | Surface tackiness | drying time: 10 min | ○ | ○ | ○ | ○ | ○ | ○ | ○ | ○ | ○ | ○ | ○ | ○ | Δ | ○ | Δ |
|  |  | drying time: 20 min | ○ | ○ | ○ | ○ | ○ | ○ | ○ | ○ | ○ | ○ | ○ | ○ | ○ | ○ | ○ |
|  |  | drying time: 30 min | ○ | ○ | ○ | ○ | ○ | ○ | ○ | ○ | ○ | ○ | ○ | ○ | ○ | ○ | ○ |
|  | Predrying time acceptable | drying time: 10 min | ○ | ○ | ○ | ○ | ○ | ○ | ○ | ○ | ○ | ○ | ○ | ○ | ○ | ○ | ○ |
|  |  | drying time: 20 min | ○ | ○ | ○ | ○ | ○ | ○ | ○ | ○ | ○ | ○ | ○ | ○ | ○ | ○ | ○ |
|  |  | drying time: 30 min | ○ | ○ | ○ | ○ | ○ | ○ | ○ | ○ | ○ | ○ | ○ | ○ | ○ | ○ | ○ |

TABLE 2-continued

|  |  |  | Examples | | | | | | | | | | | | Comparative Examples | | |
|---|---|---|---|---|---|---|---|---|---|---|---|---|---|---|---|---|---|
| Test items | | | 1 | 2 | 3 | 4 | 5 | 6 | 7 | 8 | 9 | 10 | 11 | 12 | 1 | 2 | 3 |
| | range (Developing width) | drying time: 40 min | ○ | ○ | ○ | ○ | ○ | ○ | ○ | ○ | ○ | ○ | ○ | ○ | ○ | ○ | ○ |
| | | drying time: 50 min | ○ | ○ | ○ | ○ | ○ | ○ | ○ | ○ | ○ | ○ | ○ | ○ | ○ | ○ | ○ |
| | | drying time: 60 min | ○ | ○ | ○ | ○ | ○ | ○ | ○ | ○ | ○ | ○ | ○ | ○ | Δ | ○ | Δ |
| | | drying time: 70 min | ○ | ○ | ○ | ○ | ○ | ○ | ○ | ○ | ○ | ○ | ○ | ○ | Δ | Δ | Δ |
| | | drying time: 80 min | ○ | ○ | ○ | Δ | ○ | ○ | Δ | ○ | ○ | ○ | ○ | ○ | × | Δ | × |
| | | drying time: 90 min | Δ | ○ | ○ | Δ | ○ | ○ | Δ | ○ | ○ | ○ | ○ | ○ | × | × | × |
| Remaining step number | Exposure amount: 50 mJ/cm² | | 5 | 5 | 5 | 5 | 5 | 5 | 5 | 5 | 5 | 5 | 5 | 5 | 5 | 5 | 5 |
| | Exposure amount: 150 mJ/cm² | | 8 | 8 | 8 | 8 | 8 | 8 | 8 | 8 | 8 | 8 | 8 | 8 | 8 | 8 | 8 |

TABLE 3

|  |  |  |  | Examples | | | | | | | | | | | | Comparative Examples | | |
|---|---|---|---|---|---|---|---|---|---|---|---|---|---|---|---|---|---|---|
| Test Items | | | | 1 | 2 | 3 | 4 | 5 | 6 | 7 | 8 | 9 | 10 | 11 | 12 | 1 | 2 | 3 |
| Properties of test piece under optimum exposure | Resolution | | | ○ | ○ | ○ | ○ | ○ | ○ | ○ | ○ | ○ | ○ | ○ | ○ | ○ | Δ | ○ |
| | Adhesion between solder resist and substrate | | | ○ | ○ | ○ | ○ | ○ | ○ | ○ | ○ | ○ | ○ | ○ | ○ | Δ | ○ | Δ |
| | Solder heat resistance (260° C.) | Soldering (1 time) | Discoloration to white | ◎ | ◎ | ◎ | ◎ | ◎ | ◎ | ◎ | ◎ | ◎ | ◎ | ◎ | ◎ | ○ | ○ | ○ |
| | | | Adhesion | ○ | ◎ | ◎ | ◎ | ◎ | ◎ | ◎ | ◎ | ◎ | ◎ | ◎ | ◎ | ○ | ○ | ○ |
| | | Soldering (5 times) | Discoloration to white | ○ | ○ | ○ | ○ | ○ | ○ | ○ | ○ | ○ | ○ | ◎ | ○ | × | Δ | × |
| | | | Adhesion | ○ | ○ | ○ | ○ | ○ | ○ | ○ | ○ | ○ | ◎ | ◎ | ◎ | × | Δ | × |
| | Solder heat resistance (290° C.) | Soldering (1 time) | Discoloration to white | ○ | ◎ | ◎ | ◎ | ◎ | ○ | ◎ | ○ | ◎ | ◎ | ◎ | ◎ | Δ | ○ | Δ |
| | | | Adhesion | ○ | ◎ | ◎ | ○ | ◎ | ○ | ◎ | ○ | ◎ | ◎ | ◎ | ◎ | Δ | Δ | Δ |
| | | Soldering (5 times) | Discoloration to white | ○ | ○ | ○ | ○ | ○ | Δ | ○ | ○ | ○ | ○ | ◎ | ○ | × | × | × |
| | | | Adhesion | ○ | ○ | ○ | Δ | ○ | Δ | ○ | Δ | ○ | ◎ | ◎ | ◎ | × | × | × |
| | Pencil hardness | | | 6H | 6H | 7H | 6H | 6H | 7H | 6H | 6H | 6H | 7H | 7H | 6H | 6H | 6H | 6H |
| | Resistance to gold plating | | | ○ | ○ | ○ | ○ | ○ | ○ | ○ | ○ | ○ | ○ | ○ | ○ | Δ | Δ | Δ |
| | Electrical corrosion resistance | 40° C., 90% R.H., 500 hours | | ○ | ○ | ○ | ○ | ○ | ○ | ○ | ○ | ○ | ○ | ○ | ○ | Δ | Δ | Δ |
| | | 80% R.H., heat cycle, 160 hours | | ○ | ○ | ○ | ○ | ○ | ○ | ○ | ○ | ○ | ○ | ○ | ○ | × | × | × |

[Performance Evaluation of Resist Ink]
Surface Tackiness

The photo solder resist ink was applied on a general surface of a copper clad polyimide film substrate (copper thickness/12 μm: polyimide film thickness/25 μm) by screen printing. Then, predrying was performed at 80° C. to volatilize the solvent from the applied resist ink for three different drying times, i.e., 10, 20 and 30 minutes. As a result, three kinds of predried films having the thickness of about 20 μm were obtained with respect to each of the photo solder resist inks.

Subsequently, by use of "ORC HMW680GW" (a low-pressure adhesive type double-sided exposing machine manufactured by ORC Manufacturing Co., Ltd.), a mask with a required pattern was directly put on each of the predried films, and adhered thereto under a reduced pressure. After 150 mJ/cm² of ultraviolet light was radiated through the mask, the mask was removed from the predried film. At this time, the surface tackiness of the predried film was evaluated according to the following criteria.

×: It was difficult to remove the mask from the predried film. When the mask was forcedly removed from the predried film, a considerable damage of the mask occurred, so that the mask cannot be reused.
Δ: After the mask was removed from the predried film, a sign of the mask remained on the predried film.
○: The mask was easily removed from the predried film without leaving any sign of the mask thereon.

Developing Width (Predrying Time Acceptable Range)

The resist ink was applied on a general surface of a copper clad laminate, which is composed of a glass epoxy substrate and a copper foil having the thickness of 35 μm, by screen printing. Then, predrying was performed at 80° C. to volatilize the solvent from the applied resist ink for nine different drying times, i.e., 10, 20, 30, 40, 50, 60, 70, 80 and 90 minutes. As a result, nine kinds of predried films having the thickness of about 20 μm were obtained with respect to each of the resist inks.

Subsequently, a mask having a required pattern was directly put on the predried film, and adhered thereto. After an optimum amount of ultraviolet light was radiated through the mask, developing was performed by use of a 1% sodium carbonate aqueous solution as a developer. The developing property and a condition of the formed pattern were observed and evaluated according to the following criteria.

×: It was difficult to remove unexposed portions of the predried film by developing. Therefore, it was impossible to form the pattern.
Δ: It took an extended time period to develop unexposed portions of the predried film. In addition, it was impossible to form a fine pattern.
○: Unexposed portions of the predried film were easily developed to obtain a sharp pattern.

Remaining Step Number

The photo solder resist ink was applied on a general surface of a substrate (copper thickness/12 μm) by screen printing. Predrying was performed at 80° C. for 20 minutes to volatilize the solvent from the predried film. As a result, two test pieces each having the predried film with the thickness of about 20 μm were obtained with respect to each of the resist inks.

Subsequently, by use of "ORC HMW680GW" (a low-pressure adhesive type double-sided exposing machine manufactured by ORC Manufacturing Co., Ltd.), "STEP TABLET PHOTEC 21 steps" (a mask for exposure test manufactured by Hitachi Chemical Co., Ltd.) was directly put on the predried film, and adhered thereto under a reduced pressure. 50 mJ/cm$^2$ of ultraviolet light was radiated to one of the test pieces through the mask. 150 mJ/cm$^2$ of ultraviolet light was radiated to the other one of the test pieces through the mask. Next, developing was performed by use of a 1% sodium carbonate aqueous solution as a developer. After the developing step, the remaining step number was counted to evaluate exposure sensitivity.

[Performance Evaluation of Printed Wiring Board]

To perform the performance evaluation of a printed wiring board manufactured by use of each of the photo solder resist inks, test pieces were prepared according to the following steps (1) to (5).

(1)<Applying Step>

A liquid photo solder resist ink was applied by screen printing on a general surface of a printed wiring board, which was previously manufactured by preparing a substrate (copper thickness/12 μm), and forming a required pattern thereon by etching, to obtain a resist ink layer thereon.

(2)<Predrying Step>

After the applying step, predrying was performed at 80° C. for 20 minutes to volatilize the solvent from the applied resist ink layer, to obtain a predried film having the thickness of 20 μm.

(3)<Exposing Step>

Subsequently, the predried film was selectively exposed by putting a mask having a required pattern directly on the predried film, and radiating an optimum amount of ultraviolet light through the mask.

(4)<Developing Step>

After the exposing step, unexposed portions of the predried film were developed and removed by use of a 1% sodium carbonate aqueous solution as a developer, to obtain a pattern of the predried film cured by the ultraviolet radiation on the printed wiring board.

(5)<Post-baking Step>

The printed wiring board having the predried film was heated at 150° C. for 30 minutes to cure the predried film. As a result, the test piece having a resist of the cured film was obtained.

The following evaluations were carried out with respect to the obtained test pieces.

Resolution

By use of a mask pattern having a plurality of slits, which are concentrically formed such that a slit width and a distance between adjacent slits are respectively 40 μm, a pattern of the predried film was formed. The resolution of the formed pattern was evaluated according to the following criteria.

x: It was impossible to form the pattern.
Δ: The pattern was obtained by somehow, but some defects were observed.
○: A sharp pattern was obtained.

Solder Heat Resistance

"LONCO 3355-11" (A water-soluble flux manufactured by London Chemical Co., Ltd.) was applied as a flux on the test pieces. Next, one of the test pieces was dipped once in a molten solder bath kept at 260° C. for 15 seconds and then washed by water. With respect to the other one of the test pieces, the above procedure was repeated five times. Subsequently, a degree of discoloration to white was checked. In addition, a crosscut test was performed according to JIS (Japan Industrial Standard) D 0202 by use of a cellophane adhesive tape to observe changes in adhesion.

A similar evaluation for the solder heat resistance was performed by dipping the test piece in a molten solder bath kept at 290° C. for 10 seconds.

The degree of discoloration to white was evaluated according to the following criteria x: Discoloration to white considerably occurred.
Δ: Discoloration to white occurred.
○: Extremely slight discoloration to white occurred.
⊙: There was no discoloration to white.

The adhesion was evaluated according to the following criteria.

x: Peeling or swelling of the resist occurred before the crosscut test.
Δ: Peeling of the resist was partially caused at cross-cut portions by the crosscut test.
○: There was no peeling of the resist.

Pencil Hardness

A pencil hardness of the resist was measured according to JIS K 5400, and other items were evaluated by conventional means.

Resistance to Gold Plating

Plating was performed on the test piece by use of an electroless nickel plating bath and an electroless gold plating bath. Then, adhesion of the plated film was checked according to the following criteria to evaluate the resistance to gold plating.

x: Peeling of the plated film already occurred before an adhesive tape was removed from the plated film.
Δ: There was no change of appearance of the plated film. However, peeling was partially caused when the adhesive tape was removed from the plated film.
○: There was no change.

Electrical Corrosion Resistance

In place of the test piece, a printed wiring board for evaluation was prepared by use of a spit-type electrode B of IPC B-25 under the above-explained conditions. After a bias voltage of DC 100 V was loaded to the spit-type electrode for 500 hours at the temperature of 40° C. and the humidity of 90% R.H., the occurrence of migration was checked.

In addition, in place of the above test piece, a printed wiring board for evaluation was prepared by use of a spit-type electrode B of IPC B-25 under the above-explained conditions. After a cycle described below was repeated plural times for 160 hours at the humidity of 80% R.H. under a condition that a bias voltage of DC 100 V was loaded to the spit-type electrode, the occurrence of migration was checked and evaluated. In each of the cycles, the temperature was raised from the initial temperature of 25° C. to 65° C. by 150 minutes, kept at 65° C. for 3 hours, and then cooled from 65° C. to 25° C. by 150 minutes.

The electrical corrosion resistance was evaluated according to the following criteria.

x: The occurrence of migration was confirmed.
Δ: A slight migration was confirmed.
○: There was no migration.

As understood from the experimental results of Tables 1, 2 and 3, Examples 1 to 12 show improved developing width, resolution, solder heat resistance, and resistance to gold plating, as compared with Comparative Examples 1 to 3. Especially, in Examples 10 to 12 using the 60% ultraviolet curable resin solution (E-3) with the acid value of 28 mgKOH/g, excellent adhesion is obtained even when the solder heat resistance is evaluated under the severe condition (290° C.).

Industrial Applicability

As described above, the photo solder resist ink containing the ultraviolet curable resin composition of the present invention is developable with a diluted alkali aqueous solution, and has good developing property, resolution, developing width, adhesion to substrate, and electrical corrosion resistance. Especially, it is possible to form a solder resist having excellent solder heat resistance and resistance to gold plating on a substrate. In addition, the ultraviolet curable resin composition of the present invention is available to form a protective film for color filter, or as a composition for preparing color filter pixels in the presence of a suitable pigment or dye. Moreover, by use of the ultraviolet curable resin composition or the photo solder resist ink of the present invention, it is possible to provide a dry film composed of a support and a dry film resist formed on a surface of the support.

What is claimed is:

1. An ultraviolet curable resin composition comprising:
   (A) an ultraviolet curable resin obtained by reacting an epoxy-group containing polymer (a), which is prepared by polymerizing an ethylenically unsaturated monomer component including an ethylenically unsaturated monomer (i) having an epoxy group, with an ethylenically unsaturated monomer (b) having a carboxyl group to obtain an intermediate product, and then reacting the intermediate product with a saturated or unsaturated polybasic acid anhydride (c)
   (B) an epoxy compound having at least two epoxy groups in its molecule;
   (C) a photo-polymerization initiator; and
   (D) a diluent; and
   (E) an ultraviolet curable resin having an acid value of 10 mgKOH/g or more and less than 45 mgKOH/g, which is obtained by reacting a novolac epoxy compound (e) with the ethylenically unsaturated monomer (b) having a carboxyl group, and then reacting a resultant intermediate product with the saturated or unsaturated polybasic acid anhydride (c).

2. The ultraviolet curable resin composition as set forth in claim 1, wherein the ethylenically unsaturated monomer component includes an ethylenically unsaturated monomer (iii) copolymerizable with the ethylenically unsaturated monomer (i).

3. The ultraviolet curable resin composition as set forth in claim 1, wherein the ethylenically unsaturated monomer component includes a compound (ii) having at least two ethylenically unsaturated groups in one molecule.

4. The ultraviolet curable resin composition as set forth in claim 3, wherein the ethylenically unsaturated monomer component includes an ethylenically unsaturated monomer (iii) copolymerizable with the ethylenically unsaturated monomer (i) and the compound (ii).

5. The ultraviolet curable resin composition as set forth in claim 3, wherein the compound (ii) includes di(meth)acrylate.

6. The ultraviolet curable resin composition as set forth in claim 3, wherein the compound (ii) is di(meth)acrylate having at least one oxyalkylene unit.

7. The ultraviolet curable resin composition as set forth in claim 3, wherein a content of the compound (ii) is within a range of 0.1 to 10 mol % with respect to a total amount of the ethylenically unsaturated monomer component.

8. The ultraviolet curable resin composition as set forth in claim 1, wherein the ethylenically unsaturated monomer (i) includes glycidyl (meth)acrylate.

9. The ultraviolet curable resin composition as set forth in claim 1, wherein said diluent (D) includes an ethylenically unsaturated monomer having photocurability.

10. A photo solder resist ink including the ultraviolet curable resin composition as set forth in claim 1.

11. A printed wiring board having a permanent film formed by use of the photo solder resist ink as set forth in claim 10.

12. A dry film provided by forming a film, which is obtained by drying the ultraviolet curable resin composition as set forth in claim 1, on a support.

* * * * *